(12) United States Patent
Yamada et al.

(10) Patent No.: US 10,845,409 B2
(45) Date of Patent: Nov. 24, 2020

(54) SUBSTRATE INSPECTION DEVICE

(71) Applicant: Tokyo Electron Limited, Tokyo (JP)

(72) Inventors: Hiroshi Yamada, Yamanashi (JP); Jun Fujihara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 16/335,354

(22) PCT Filed: Aug. 25, 2017

(86) PCT No.: PCT/JP2017/031504
§ 371 (c)(1),
(2) Date: Mar. 21, 2019

(87) PCT Pub. No.: WO2018/056021
PCT Pub. Date: Mar. 29, 2018

(65) Prior Publication Data
US 2019/0331731 A1    Oct. 31, 2019

(30) Foreign Application Priority Data

Sep. 23, 2016  (JP) .................................. 2016-185724

(51) Int. Cl.
*G01R 31/28* (2006.01)
*G01R 31/26* (2020.01)
*H01L 21/67* (2006.01)

(52) U.S. Cl.
CPC ......... *G01R 31/2865* (2013.01); *G01R 31/26* (2013.01); *G01R 31/2862* (2013.01);
(Continued)

(58) Field of Classification Search
CPC ............ G01R 31/2879; G01R 31/2818; G01R 31/2817
(Continued)

(56) References Cited

U.S. PATENT DOCUMENTS

| 2010/0020499 | A1* | 1/2010 | Lee ...................... H01L 23/3677 361/709 |
| 2011/0108245 | A1* | 5/2011 | Tan .......................... F28D 15/04 165/104.26 |
| 2017/0098592 | A1* | 4/2017 | Jin .......................... H01L 23/552 |

FOREIGN PATENT DOCUMENTS

| JP | 2002-022768 A | 1/2002 |
| JP | 2015-097292 A | 5/2015 |

(Continued)

OTHER PUBLICATIONS

International Search Report dated Nov. 21, 2017 for WO 2018/056021 A1.

*Primary Examiner* — Giovanni Astacio-Oquendo

(74) *Attorney, Agent, or Firm* — Abelman, Frayne & Schwab

(57) ABSTRACT

A substrate inspection device includes: a holding member configured to hold a probe card; a plate-shaped chuck facing the probe card and configured to place a substrate thereon; and an inspection chamber in which the holding member and the chuck are disposed. The substrate is brought into contact with the probe card by moving the chuck closer to the holding member. A sealed space is formed between the holding member and the chuck. A contact state between the probe card and the substrate are maintained by decompressing the sealed space. A gas introduction path is provided separately from the inspection chamber and configured to introduce a gas in a partitioned space into the sealed space, and the partitioned space is filled with a dry gas.

12 Claims, 4 Drawing Sheets

(52) U.S. Cl.
CPC ..... *G01R 31/2872* (2013.01); *G01R 31/2887* (2013.01); *H01L 21/67017* (2013.01); *H01L 21/67242* (2013.01)

(58) Field of Classification Search
USPC .......................... 324/750.3, 500, 537, 750.01
See application file for complete search history.

(56) References Cited

FOREIGN PATENT DOCUMENTS

| | | |
|---|---|---|
| KR | 10-2013-0032647 A | 4/2013 |
| KR | 10-2016-0022775 A | 3/2016 |
| TW | 201415050 A | 4/2014 |
| TW | 201418733 A | 5/2014 |

\* cited by examiner

SUBSTRATE INSPECTION DEVICE

CROSS REFERENCE TO RELATED APPLICATIONS

This application is a national phase of PCT application No. PCT/JP2017/031504, filed on 25 Aug. 2017, which claims priority from Japanese patent application No. 2016-185724, filed on 23 Sep. 2016, all of which are incorporated herein by reference.

TECHNICAL FIELD

The present disclosure relates to a substrate inspection device.

BACKGROUND

A wafer prober is used as an inspection device in order to inspect a wafer on which a large number of semiconductor devices are formed. The prober includes a probe card facing a wafer, and the probe card includes a plate-shaped base unit and a plurality of contact probes (probe needles columnar) serving as contact terminals arranged in the base unit so as to face respective electrode pads or respective solder bumps in the semiconductor devices of the wafer (see, e.g., Patent Document 1).

In the prober, by bringing the wafer into contact with the probe card using a stage on which the wafer is placed, each contact probe of the probe card is brought into contact with an electrode pad or a solder bump in the semiconductor devices, and causing electricity to flow from each contact probe to an electric circuit of the conductor device connected to each electrode pad or each bump, electrical characteristics such as, for example, the conduction state of the electric circuit, are inspected.

Further, there has been developed a wafer inspection device in which, in order to improve wafer inspection efficiency, multiple probe cards are arranged in an inspection chamber and while a wafer is being transported to one probe card by a transport stage, semiconductor devices of another wafer is capable of being inspected using another probe card. In this wafer inspection device, multiple testers are arranged in the inspection chamber as wafer inspection interfaces arranged so as to be able to face a wafer, and a probe card is attached to each tester.

Meanwhile, in such a wafer inspection device, since it is impossible to provide a transport stage corresponding to each tester due to cost and layout restrictions, it is difficult to continuously keep a wafer in contact with a probe card using the transport stage in order to inspect the electrical characteristics of semiconductor devices. Thus, a plate-shaped chuck top for placing a wafer in correspondence with each tester is provided separately from the transport stage, the wafer is brought into contact with a probe card by bringing the chuck top close to the tester, and a space between a pogo frame for holding the probe card and the chuck top (hereinafter, referred to as a "sealed space") is sealed, and the sealed space is decompressed to shrink the sealed space so as to attract the wafer to the pogo frame together with the chuck top, thereby continuously keeping the wafer in contact with the probe card (see, e.g., Patent Document 2). In addition, when the inspection of the electrical characteristics of semiconductor devices is completed, the decompression state of the sealed space is eliminated by increasing the pressure of the sealed space, the chuck top is moved away from the pogo frame, and the wafer is separated from the probe card.

PRIOR ART DOCUMENT

Patent Document

[Patent Document 1] Japanese Patent Laid-Open Publication No. 2002-022768
[Patent Document 2] Japanese Patent Laid-Open Publication No. 2015-097292

SUMMARY OF THE INVENTION

Problem to be Solved

However, inspection of electrical characteristics of a semiconductor device may be performed at an extremely low temperature (e.g., around −30° C.). In this case, when atmospheric air is introduced into the sealed space in order to increase the pressure of the sealed space after completion of a test, moisture in atmospheric air may condense on the cooled substrate or chuck top. Thus, in order to prevent condensation, it has also been considered to introduce a gas in the test chamber into which a dry gas (e.g., dry air) is introduced, into the sealed space. In this case, however, it is necessary to route a gas introduction path for introducing the gas in the inspection chamber into the sealed space from the inspection chamber via a solenoid valve as a gas introduction control device. In addition, the majority of the gas introduction path is disposed at an atmospheric exposure site of the wafer inspection device due to a layout restriction. That is, since the relatively long gas introduction path is disposed at an atmospheric exposure site, atmospheric air easily permeates into the gas introduction path. As a result, as atmospheric air is easily introduced into the sealed space, it is difficult to prevent condensation from occurring.

An object of the present disclosure is to provide a substrate inspection device capable of preventing condensation.

Means to Solve the Problem

In order to achieve the object described above, according to the present disclosure, there is provided a substrate inspection device including: a holding member configured to hold a probe card; a plate-shaped chuck facing the probe card and configured to place a substrate thereon; and an inspection chamber in which the holding member and the chuck are disposed, in which the substrate is brought into contact with the probe card by moving the chuck closer to the holding member, a sealed space is formed between the holding member and the chuck, a contact state between the probe card and the substrate is maintained by decompressing the sealed space. The substrate inspection device further includes a gas introduction path provided separately from the inspection chamber and configured to cause a gas in a partitioned space to be introduced into the sealed space, and the partitioned space is filled with a dry gas.

Effect of the Invention

According to the present disclosure, since the gas introduction path causes the dry gas filled in the partitioned space to be introduced into the sealed space and the partitioned space is provided separately from the inspection chamber, it is possible to eliminate the necessity of routing the gas introduction path from the inspection chamber to the sealed space, thereby making the gas introduction path relatively short. As a result, it is possible to suppress atmosphere air from permeating into the gas introduction path, and allow only the dry gas filled in a partitioned space to be introduced into the sealed space. Thus, it is possible to reliably prevent atmospheric air from being introduced into the sealed space, and prevent condensation from occurring.

DETAILED DESCRIPTION TO EXECUTE THE INVENTION

Hereinafter, embodiments of the present disclosure will be described with reference to the accompanying drawings.

First, a wafer inspection device as a substrate inspection device according to an embodiment of the present disclosure will be described.

Figure 1:
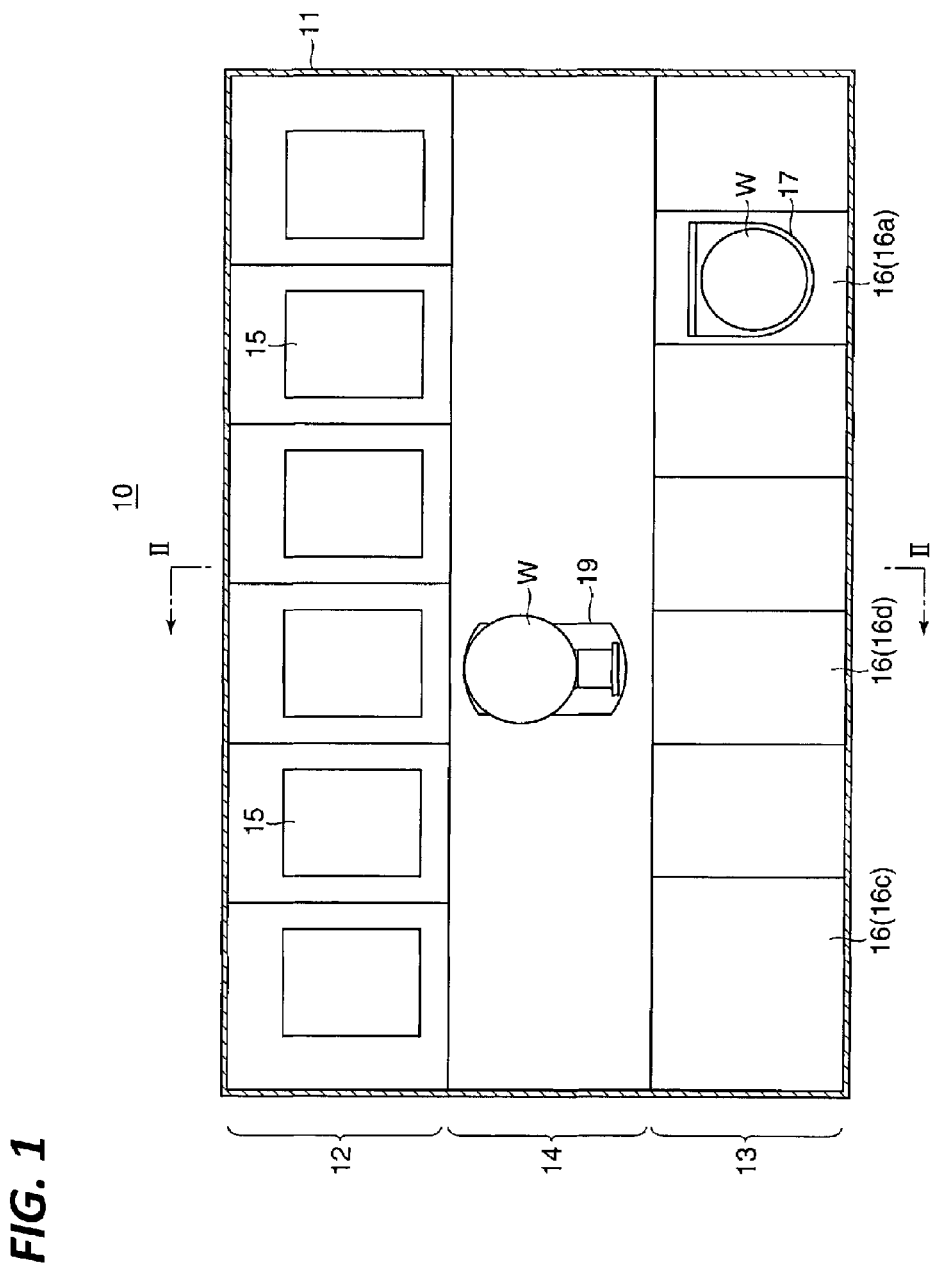
FIG. 1 is a horizontal cross-sectional view schematically illustrating a configuration of a wafer inspection device as a substrate inspection device according to an embodiment of the present disclosure.
Figure 2:
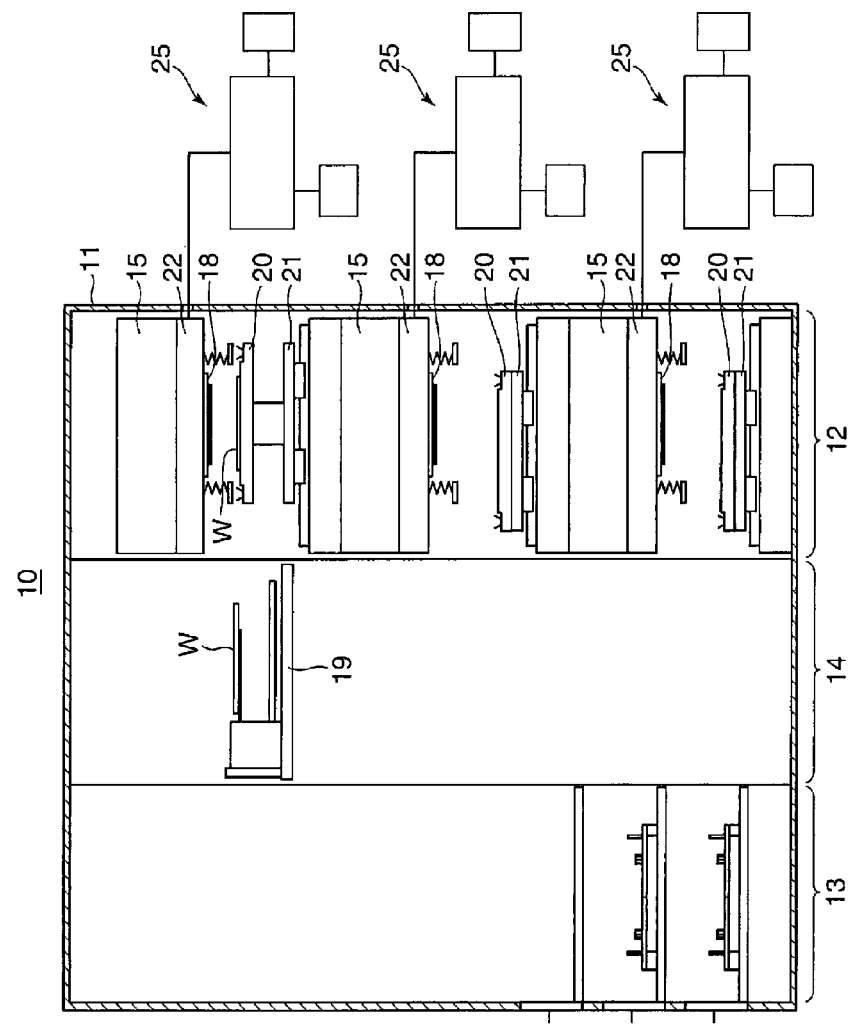
FIG. 2 is a longitudinal cross-sectional view taken along line II-II in FIG. 1.

FIG. 1 is a horizontal cross-sectional view schematically illustrating a configuration of a wafer inspection device as a substrate inspection device according to an embodiment of the present disclosure, and FIG. 2 is a longitudinal cross-sectional view taken along line II-II in FIG. 1.

In FIGS. 1 and 2, a wafer inspection device 10 includes an inspection chamber 11, which includes an inspection region 12 in which inspection of electrical characteristics of semiconductor devices of a wafer W is performed, a loading/unloading region 13 in which loading/unloading of a wafer W into/from the inspection chamber 11 is performed, and a transport region formed between the inspection region 12 and the loading/unloading region 13. A plurality of testers 15 as wafer inspection interfaces are arranged in the inspection region 12, and a pogo frame 22 (a holding member) configured to hold a probe card 18 is attached to the lower portion of each of the testers 15.

The loading/unloading region 13 is partitioned into a plurality of accommodation spaces 16, and in each accommodation space 16, a port 16a configured to receive a container that accommodates a plurality of wafers W (e.g., a FOUP 17), a loader 16c configured such that the probe card 18A is loaded into/unloaded from the loader 16c, and a controller 16d configured to control the operation of each component of the wafer inspection device 10 are disposed.

In the inspection region 12, corresponding to each tester 15, a chuck top 20 (chuck) made of a plate-shaped member configured to place and suck a wafer W thereon is disposed so as to face the probe card 18. The chuck top 20 is supported on an aligner 21, and the aligner 21 moves the chuck top 20 upward, downward, leftward, and rightward so as to make the wafer W placed on the chuck top 20 directly face the probe card 18.

A movable transport robot 19 is disposed in the transport region 14. The transport robot 19 receives a wafer W from the port 16a of the loading/unloading region 13 and transports the wafer W to the chuck top 20 corresponding to each tester 15, and transports a wafer W on which inspection of electrical characteristics of semiconductor devices has been completed from the chuck top 20 corresponding to each tester 15 to the port 16a. In addition, the transport robot 19 transports a probe card 18 that needs to be maintained from each tester 15 to the loader 16c in the loading/unloading region 13 and also transports a new or maintained probe card 18 from the loader 16c to each tester 15.

In the wafer inspection device 10, each tester 15 performs inspection of electrical characteristics of the semiconductor devices of the transported wafer. While the transport robot 19 transports the wafer toward one tester 15, another tester 15 is capable of inspecting the electrical characteristics of the semiconductor devices of another wafer, so that wafer inspection efficiency can be improved.

FIGS. 3A to 3E are process diagrams for describing operations of, for example, a chuck top in inspection of electrical characteristics of semiconductor devices of a wafer.

Figure 3A:
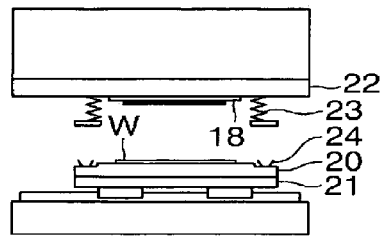
FIGS. 3A to 3E are process diagrams for describing operations of, for example, a chuck top in inspection of electrical characteristics of semiconductor devices of a wafer.
Figure 3B:
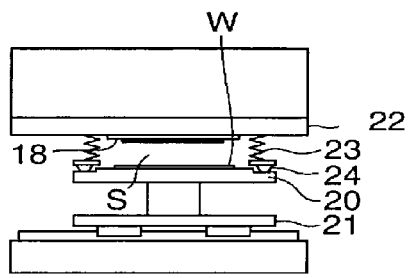

First, the aligner 21 moves the chuck top 20 that has received a wafer W from the transport robot 19 so as to make the wafer W placed on the chuck top 20 face the probe card 18 directly (FIG. 3A). In the wafer inspection device 10, a cylindrical expansible bellows 23 hangs down from the pogo frame 22 and an annular lip seal 24 is disposed on the chuck top 20 so as to surround the wafer W. When the aligner 21 raises the chuck top 20 to move the wafer W closer to the probe card 18, the bellows 23 comes into contact with the lip seal 24 to form a sealed space S surrounded by the chuck top 20, the pogo frame 22, the bellows 23, and the lip seal 24 (see FIG. 3B).

Figure 3C:
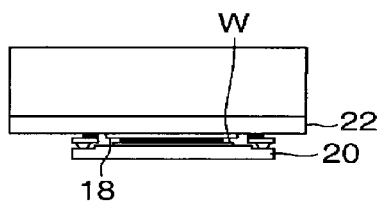

Thereafter, when the aligner 21 further raises the chuck top 20, the wafer W eventually comes into contact with the probe card 18. Next, when the sealed space S is decompressed, the sealed space S contracts and the chuck top 20 is attracted to the pogo frame 22. Thus, the contact state of the probe card 18 and the wafer W is maintained. In the wafer inspection device 10, since the chuck top 20 is only supported on the aligner 21, when the chuck top 20 is attracted to the pogo frame 22, the chuck top 20 is separated from the aligner 21 (FIG. 3C). Meanwhile, the aligner 21 waits under the chuck top 20. Thereafter, by causing electricity to flow from the probe card 18 to the electric circuits of the semiconductor devices of the wafer W, electrical characteristics such as, for example, the conduction state of the electric circuits, are inspected.

Figure 3D:
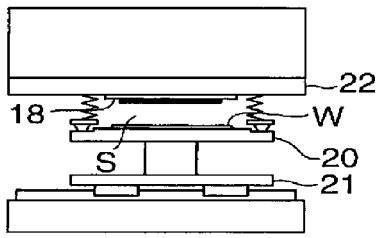
Figure 3E:
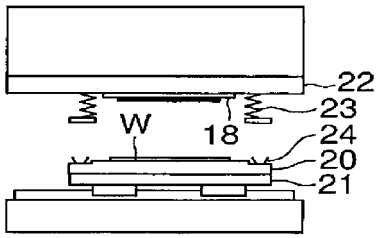

When the inspection of the electrical characteristics of the semiconductor devices is completed, a gas is introduced into the sealed space S and the pressure of the sealed space S is increased, whereby the decompression state of the sealed space S is eliminated and the chuck top 20 moves away from the pogo frame 22 and the wafer W is separated from the probe card 18. At this time, the aligner 21 waiting under the chuck top 20 receives the chuck top 20 (FIG. 3D). Next, the aligner 21 moves down to separate the lip seal 24 from the bellows 23 (FIG. 3E). Thereafter, the aligner 21 moves to deliver the wafer W from the chuck top 20 to the transport robot 19.

Returning back to FIG. 2, a plurality of gas control units 25 provided separately from the inspection chamber 11 are arranged in the wafer inspection device 10. In each gas control unit 25, in correspondence to each tester 15, that is, one gas control unit 25 is provided for one tester 15, and the gas control unit 25 introduces gas into the sealed space S in the corresponding tester 15.

Figure 4:
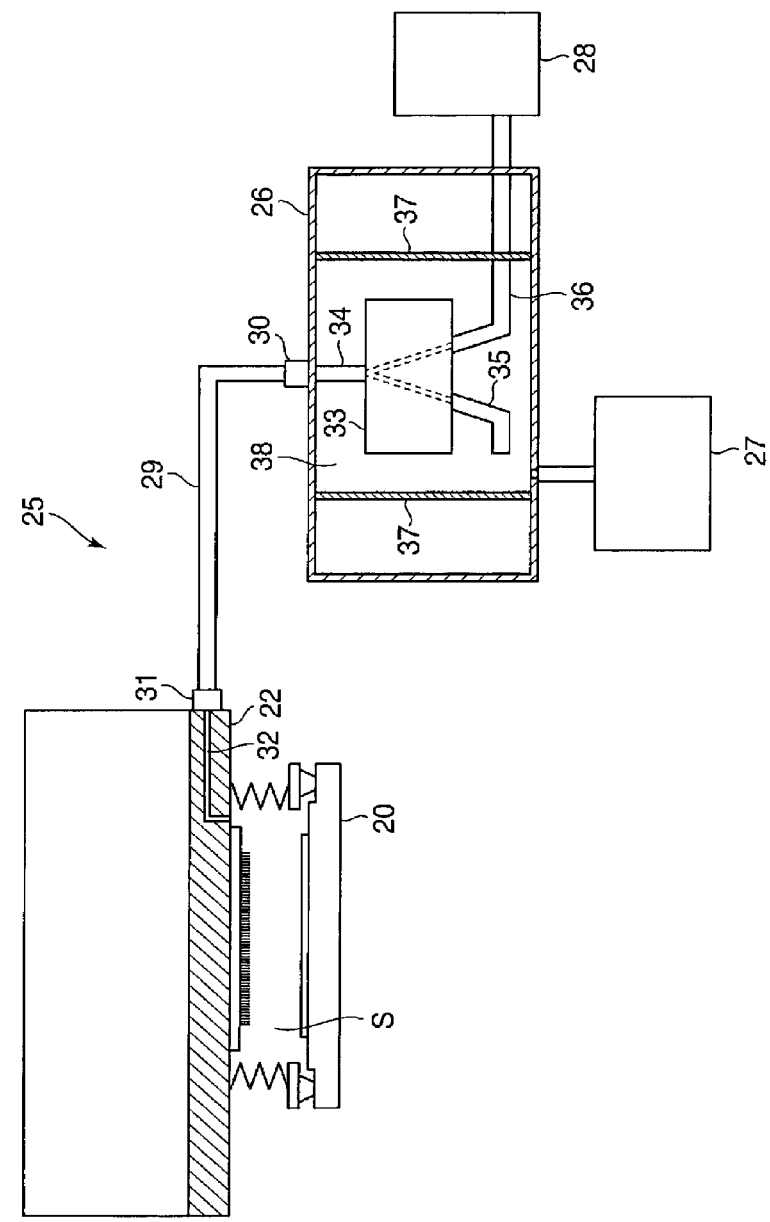
FIG. 4 is a view schematically illustrating a configuration of a gas control unit in FIG. 2.

FIG. 4 is a view schematically illustrating a configuration of a gas control unit in FIG. 2. In FIG. 4, for easy understanding, a portion is drawn in a sectional view.

In FIG. 4, the gas control unit 25 includes a case-shaped gas controller 26, a dry gas supply unit 27, a decompression pump 28, and a gas introduction pipe 29. The gas introduction pipe 29 is composed of a non-moisture-permeable material (e.g., Teflon (registered trademark)), and is connected to the gas controller 26 and the pogo frame 22 via metal joints 30, 31. Inside the pogo frame 22, a communication path 32 is formed to communicate the gas introduction pipe 29 and the sealed space S with each other. The gas controller 26 includes a solenoid valve 33, a connection pipe 34 that connects the solenoid valve 33 and the gas introduction pipe 29 to each other, an intake pipe 35 that is connected to the solenoid valve 33, and a decompression pipe 36 that connects the solenoid valve 33 and the decompression pump 28 to each other.

The gas controller 26 includes a dry gas chamber 38 partitioned by partition walls 37 and isolated from atmospheric air, and the solenoid valve 33, the connection pipe 34, and the intake pipe 35 are disposed in the internal space of the dry gas chamber 38. The dry gas supply unit 27 is connected to the dry gas chamber 38 and always fills the internal space of the dry gas chamber 38 with a dry gas (e.g., dry air). One end of the intake pipe 35 is opened in the internal space of the dry gas chamber 38, and the intake pipe 35, the solenoid valve 33, the connection pipe 34, the gas introduction pipe 29, and the communication path 32 are connected to the internal space of the dry gas chamber 38 and the sealed space S.

The solenoid valve 33 selectively connects the connection pipe 34 and thus the gas introduction pipe 29 to either the intake pipe 35 or the decompression pipe 36. When the solenoid valve 33 connects the gas introduction pipe 29 to the intake pipe 35, the gas filled in the internal space of the dry gas chamber 38 is sucked into the decompressed sealed space S via the intake pipe 35, the solenoid valve 33, the connection pipe 34, the gas introduction pipe 29, and the communication path 32. That is, the intake pipe 35, the solenoid valve 33, the connection pipe 34, the gas introduction pipe 29, and the communication path 32 constitute a gas introduction path for introducing the dry gas into the sealed space S. Meanwhile, when the solenoid valve 33 connects the gas introduction pipe 29 to the decompression pipe 36, the decompression pump 28 decompresses the sealed space S via the decompression pipe 36, the solenoid valve 33, the connection pipe 34, the gas introduction pipe 29, and the communication path 32.

According to the wafer inspection device 10 according to the present embodiment, the gas introduction path including the intake pipe 35, the solenoid valve 33, the connection pipe 34, the gas introduction pipe 29, and the communication path 32 introduces the dry gas filled in the internal space of the dry gas chamber 38 into the sealed space S, and the dry gas chamber 38 is provided separately from the inspection chamber 11, it is possible to eliminate the necessity of routing the gas introduction pipe 29 in the gas introduction path from the inspection chamber 11 to the sealed space S, and thus, it is possible to make the gas introduction pipe 29 relatively short. As a result, it is possible to suppress atmospheric air from permeating into the gas introduction pipe 29, and only the dry gas filled in the internal space of the dry gas chamber 38 is able to be introduced into the sealed space S. As a result, it is possible to reliably prevent atmospheric air from being introduced into the sealed space S, and it is possible to prevent condensation from occurring on a wafer W and the chuck top 20.

In the gas control unit 25, since the gas introduction pipe 29 is made of Teflon which is a non-moisture-permeable material, it is possible to prevent atmospheric air from directly permeating into the gas introduction pipe 29. In addition, since the joints 30, 31 of the gas introduction pipe 29 are made of a metal, it is possible to prevent atmospheric air from permeating into the gas introduction pipe 29 from the joints 30, 31.

In addition, since the dry gas is constantly filled in the dry gas chamber 38 from the dry gas supply unit 27, it is possible to introduce the dry gas into the sealed space S when it is needed regardless of the timing, and thus, it is possible to securely prevent occurrence of condensation.

In the wafer inspection device 10, the gas introduction path introduces the dry gas into the sealed space S via the pogo frame 22 (the communication path 32), but since the sealed space S is formed between the pogo frame 22 and the chuck top 20, that is, since the pogo frame 22 faces the sealed space S, the dry gas is able to be quickly introduced into the sealed space S. Accordingly, the decompression state of the sealed space S is able to be quickly released, and thus it is possible to quickly separate the wafer W from the probe card 18.

Further, in the wafer inspection device 10, since the gas introduction path is branched by the solenoid valve 33 and connected to the decompression pump 28, it is possible to decompress the sealed space S using the gas introduction path. That is, since it is not necessary to provide a path separate from the gas introduction path for decompressing the sealed space S, it is possible to simplify the configuration of the wafer inspection device 10.

Meanwhile, since the dry gas is normally introduced into the inspection chamber 11, for example, it is also considered that the dry gas inside the inspection chamber 11 is directly introduced into the sealed space S by the communication path 32 by opening one end of the communication path 32 to the inside of the inspection chamber 11, rather than connecting the one end of the communication path 32 to the gas introduction pipe 29. However, when the inside of the inspection chamber 11 is opened to atmospheric air by, for example, maintenance, internal resin components may absorb moisture, and furthermore, atmospheric air may remain in, for example, fine pipes. Therefore, even if gas is introduced into the inside of the inspection chamber 11, the residual atmospheric air may be introduced into the sealed space S via the communication path 32, and further, moisture released from the resin components may be introduced into the sealed space S via the communication path 32. On the contrary, in the present embodiment, since the dry gas is introduced into the sealed space S from the inside of the dry gas chamber 38, which is isolated from atmospheric air and is always filled with the dry gas, there is an advantage in that it is possible to securely prevent introduction of moisture or atmospheric air into the sealed space S compared to the case where the gas is directly introduced into the sealed space S.

Although the present disclosure has been described above with reference to the above-described embodiments, the present disclosure is not limited to the above-described embodiments.

For example, in the wafer inspection device 10, the communication path 32 is provided in the pogo frame 22 and the dry gas is introduced into the sealed space S from the communication path 32. However, a communication path opening to the sealed space S may be provided in the chuck top 20 and the gas introduction pipe 29 may be connected to the communication path so as to introduce the dry gas into the sealed space S from the communication path of the chuck top 20.

In the wafer inspection device 10, the dry gas supply unit 27 fills the dry gas chamber 38 with dry air as the dry gas in consideration of cost and safety. However, the gas to be filled in the dry gas chamber 38 is not limited to dry air, and other dry gases (e.g., dry inert gas) may be filled in the dry gas chamber 38.

In addition, the sealed space S is enclosed by the pogo frame 22, the bellows 23, the lip seal 24, and the chuck top 20. However, a sealed space may be formed between the probe card 18 and the wafer W by making the bellows suspend from the probe card 18 and bringing the bellows into contact with the wafer W.

This application claims priority based on Japanese Patent Application No. 2016-185724 filed on Sep. 23, 2016, the disclosure of which is incorporated herein in its entirety by reference.

DESCRIPTION OF SYMBOLS

S: sealed space, 11: inspection chamber, 18: probe card, 20: chuck top, 22: pogo frame, 25: gas control unit, 28: decompression pump, 39: gas introduction pipe, 30, 31: joint, 38: dry gas chamber

The invention claimed is:

1. A substrate inspection device comprising:
a holding member configured to hold a probe card;
a plate-shaped chuck facing the probe card and configured to place a substrate thereon; and
an inspection chamber in which the holding member and the chuck are disposed, the substrate being brought into contact with the probe card by moving the chuck closer to the holding member, a sealed space being formed between the holding member and the chuck, and a contact state between the probe card and the substrate being maintained by decompressing the sealed space,
wherein a gas introduction path is provided separately from the inspection chamber and configured to introduce a gas in a partitioned space into the sealed space, and
the partitioned space is filled with a dry gas.

2. The substrate inspection device of claim 1, wherein the gas introduction path is made of a non-moisture-permeable material.

3. The substrate inspection device of claim 2, wherein the gas introduction path includes at least one joint which is made of a metal.

4. The substrate inspection device of claim 3, wherein the partitioned space is always filled with the dry gas.

5. The substrate inspection device of claim 4, wherein the gas introduction path causes the dry gas to be introduced into the sealed space through the holding member.

6. The substrate inspection device of claim 5, wherein the gas introduction path is branched to be connected to a decompression pump.

7. The substrate inspection device of claim 6, wherein the dry gas includes dry air.

8. The substrate inspection device of claim 1, wherein the gas introduction path includes at least one joint which is made of a metal.

9. The substrate inspection device of claim 1, wherein the partitioned space is always filled with the dry gas.

10. The substrate inspection device of claim 1, wherein the gas introduction path causes the dry gas to be introduced into the sealed space through the holding member.

11. The substrate inspection device of claim 1, wherein the gas introduction path is branched to be connected to a decompression pump.

12. The substrate inspection device of claim 1, wherein the dry gas includes dry air.

* * * * *